(12) United States Patent
Staple et al.

(10) Patent No.: US 7,560,037 B2
(45) Date of Patent: Jul. 14, 2009

(54) SURFACTANT-ENHANCED PROTECTION OF MICROMECHANICAL COMPONENTS FROM GALVANIC DEGRADATION

(75) Inventors: Bevan Staple, Longmont, CO (US); Jillian Buriak, West Lafayette, IN (US)

(73) Assignee: Altera Corporation, San Jose, CA (US)

( * ) Notice: Subject to any disclaimer, the term of this patent is extended or adjusted under 35 U.S.C. 154(b) by 243 days.

(21) Appl. No.: 11/213,466

(22) Filed: Aug. 26, 2005

(65) Prior Publication Data

US 2007/0289940 A1 Dec. 20, 2007

Related U.S. Application Data

(62) Division of application No. 10/242,213, filed on Sep. 12, 2002, now Pat. No. 7,153,440.

(51) Int. Cl.
*H01B 13/00* (2006.01)
(52) U.S. Cl. .......................... 216/13; 216/108
(58) Field of Classification Search ............ None
See application file for complete search history.

(56) References Cited

U.S. PATENT DOCUMENTS

| | | | |
|---|---|---|---|
| 4,690,715 A | 9/1987 | Allara et al. | |
| 5,698,112 A | 12/1997 | Naeher et al. | |
| 6,124,214 A | 9/2000 | Hembree et al. | |
| 6,352,909 B1 | 3/2002 | Usenko | |
| 6,616,853 B1 | 9/2003 | Staple et al. | |
| 2002/0072163 A1 | 6/2002 | Wong et al. | |
| 2004/0065637 A1 | 4/2004 | Staple et al. | |

FOREIGN PATENT DOCUMENTS

| WO | WO 02/48023 A2 | 6/2002 |
|---|---|---|
| WO | WO 02/057179 A2 | 7/2002 |

OTHER PUBLICATIONS

Tam-Chang, S.W., et al., "Self-Assembled Monolayers (SAMs') of Alkanethiolates with the Structure RNHCOCH2SH," Langmuir 1995, 11, pp. 4371-4382.
Tamada, K., et al., Molecular Packing of Semifluorinated Alkanethiol Self-Assembled Monolayers on Gold: Influence of Alkyl Spacer Length, Langmuir 2001, 17, pp. 1913-1921.

(Continued)

*Primary Examiner*—Allan Olsen
(74) *Attorney, Agent, or Firm*—Townsend and Townsend and Crew LLP (57) ABSTRACT

A microelectromechanical structure is formed by depositing sacrificial and structural material over a substrate to form a structural layer on a component electrically attached with the substrate. The galvanic potential of the structural layer is greater than the galvanic potential of the component. At least a portion of the structural material is covered with a protective material that has a galvanic potential less than or equal to the galvanic potential of the component. The sacrificial material is removed with a release solution. At least one of the protective material and release solution is surfactanated, the surfactant functionalizing a surface of the component.

16 Claims, 9 Drawing Sheets

OTHER PUBLICATIONS

Torcheux, l., et al., "Electrochemical Coupling Effects on the Corrosion of Silicon Samples in HF Solutions," J. Electrochem. Soc. vol. 142, No. 6, Jun. 1995.

Ark-Chew Wong, John R. Clark and Clark T.-C. Nguyen, *Anneal-Activated, Tunable, 68 MHz Micromechanical Filters*, Center for Integrated Microsystems, Dept. of Electrical Engineering and Computer Science, University of Michigan, Ann Arbor, Michigan 48109, Transducers '99, Jun. 7-10, 1999, pp. 1390-1393, Sendai, Japan.

Buriak Jillian M., et al. "Functionalization of Porous Silicon Surfaces Through Hydrosilylation Reactions", Mater. Res. Soc. Symp. Proc. 1998, 536, pp. 173-178.

Monk, D.J. et al., "Hydrofluoric Acid Etching of Silicon Dioxide Sacrificial Layers I. Experimental Observations", Journal of the Electrochemical Society, Manchester, New Hampshire, U.S., vol. 141, No. 1, 1994, pp. 264-269, XP000445658, ISSN: 0013-4651.

Gennissen P.T.J. et al., "Sacrificial Oxide Etching Compatible with Aluminum Metallization", 1997 International Conference on Solid0State Sensors and Actuators, Digest of Technical Papers, Transducers 97, Chicago, IL, Jun. 16-19, 1997, Sessions 3A1-403. Papers No. 3A1.01-403.14P, vol. 2, Jun. 16, 1997, pp. 225-228, XP010240450, New York, NY, USA, ISBN: 0-7803-3829-4.

Ashruf, C.M.A., et al., "Galvanic porous silicon formation without external contacts," Sensors and Actuators 74, Jun. 1999, pp. 118-122.

Buriak, Jillian, et al., "Photoluminescence of Porous Silicon Surfaces Stabilized Through Lewis Acid Mediated Hydrosilylation," 1999, 80, pp. 29-35.

Buriak, Jillian, et al., "Lewis Acid Mediated Hydrosilylation on Porous Silicon Surfaces," American Chemical Society 1999, pp. 11491-11502.

Bustillo, James M., et al, "Surface Micromachining for Microelectromechanical Systems," Proceedings of the IEEE, vol. 86, No. 8, Aug. 1998; pp. 1552-1574.

Dewa, A.S., et al., "Development of a Silicon Two-Axis Micromirror for an Optical Cross-Connect," Solid State Sensors and Actuator Workshop, Hilton Head, SC, Jun. 4-8, 2000, pp. 93-96.

Feng, Yiqi, et al., "Corrosion Protection of Copper by a Self-Assembled Monolayer of Alkanethoil," J. Electrochem. Soc., vol. 144, No. 1, Jan. 1997, pp. 55-63.

Ford, Jospeh, et al., "Wavelength Add-Drop Switching Using Tilting Micromirrors," Journal of Lightwave Technology, vol. 17, No. 5, May 1999, pp. 904-911.

Gennisen, P., et al., "Sacrificial Oxide Etching Compatible with Aluminum Metallization," Transducers 97, pp. 225-228, 1997.

Itoh, Miki, et al, "A Chemical Modification of Alkanethoil Self-Assembled Monolayers with Alkyltrichlorosilanes for the Protection of Copper Against Corrosion," J. Electrochem. Soc., vol. 141, No. 8, Aug. 1994, pp. 2018-2023.

Keller, Luke D., et al., "Fabrication and testing of chemically micromachined silicon echelle gratings," Applied Optics, vol. 29, No. 7, Mar. 1, 2000, pp. 1094-1105.

Keller, Christopher Guild, Microfabricated Silicon High Aspect Ratio Flexures for In-Plane Motion, dissertation submitted in the graduate division of the University of California, Berkeley, Fall 1998.

Kim, Dong Ho., et al., "An Absorption Process Study on the Self-Assembled Monolayer Formation of Octadecanethiol Chemisorbed on Gold Surface," Bull. Korean Chem. Soc., 2001, vol. 22, No. 3, pp. 276-280.

Muller, Lilac, "Gimballed Electrostatis Microactuarors with Embedded Interconnects," dissertation submitted in the graduate division of the University of California, Berkeley, Spring 2000..

Nuzzo, R.G., et al., "Adsorption of Bifunctional Organic Disulfides on Gold Surfaces," J. Amer. Chem. Soc., 105, 4481, 1983.

Shon, Young-Seok, et al., "Desorption and Exchange of Self-Assembled Monolayers (SAMs) on Gold Generated from Chelating Alkanedithiols," J. Phys. Chem B 2000, 104, pp. 8192-8200.

SURFACTANT-ENHANCED PROTECTION OF MICROMECHANICAL COMPONENTS FROM GALVANIC DEGRADATION

CROSS REFERENCE TO RELATED APPLICATION

This application is a divisional application of U.S. patent application Ser. No. 10/242,213, filed Sep. 12, 2002, entitled "SURFACTANT-ENHANCED PROTECTION OF MICROMECHANICAL COMPONENTS FROM GALVANIC DEGRADATION", which is related to commonly assigned U.S. Pat. No. 6,616,853, entitled "METHOD FOR REDUCING LEACHING IN METAL-COATED MEMS," which issued Sep. 9, 2003. Each of the foregoing applications is hereby incorporated by reference for all purposes.

BACKGROUND OF THE INVENTION

This application relates generally to the formation of microelectromechanical devices and more specifically to protecting components of the microelectromechanical devices from galvanic degradation.

In recent years, increasing emphasis has been made on the development of techniques for producing microscopic systems that may be tailored to have specifically desired electrical and/or mechanical properties. Such systems are generically described as microelectromechanical systems ("MEMS") and are desirable because they may be constructed with considerable versatility despite their very small size. The micromachining procedure generally uses a combination of deposition, patterning, and etching processes to produce an intermediate structure. This intermediate structure may include both "structural material" intended to form part of the final device and "sacrificial material" that is intended to be dissolved in forming the final device.

The removal of this sacrificial material is referred to as a "release," and typically involves a chemical reaction. For example, the sacrificial material often comprises silicon dioxide $SiO_2$, which is removed during the release with hydrofluoric acid HF. The structural material of the MEMS device typically includes materials having different galvanic potentials, such as when electrical and mechanical components are made of silicon or polysilicon are connected to metals such as gold for optical, wirebonding, and other purposes. In these cases, the HF acts as an electrolyte, and when added to the system causes it to behave as a galvanic cell. The action of this galvanic cell may cause damage to the silicon and/or gold, severely degrading the electrical and mechanical integrity of the MEMS device. In addition to such galvanic degradation, electrochemical attack of the aluminum and copper interconnects used in CMOS-integrated MEMS devices from the HF remains a persistent problem for MEMS manufacturing. Such electrochemical degradation leads to reduced product yield, performance, and reliability.

In order to avoid these harmful effects of the HF, it is common to seek micromachining methods that limit the exposure of the structural material to the HF during the release. Simply reducing the length of time the intermediate structure is exposed to the HF is often not viable because the sacrificial layers may then be incompletely removed. Accordingly, reducing the exposure of the structural material is usually achieved by adding additional fabrication steps to minimize the exposure of the structural material. The additional complexity of the fabrication process that results increases both fabrication costs and the possibility of producing defective structures. It has alternatively been suggested that the electrochemical attack of aluminum and copper interconnects in CMOS-integrated MEMS may be mitigated by using more concentrated HF, such as with a 73% HF solution instead of the more customary 48% HF solution. This method has a number of drawbacks, including the fact that such stronger-concentration HF solutions are extremely dangerous and are not generally available for commercial use.

There is thus a continuing need in the art for methods of releasing MEMS structures that limit damage caused to the structural material.

BRIEF SUMMARY OF THE INVENTION

Embodiments of the invention thus provide methods for forming microelectromechanical structures or devices that substantially suppress the effects of galvanic degradation. Such methods exploit certain synergistic effects discovered by the inventors.

In a first set of embodiments, formation of a microelectromechanical structure begins by depositing sacrificial and structural material over a substrate to form a structural layer on a component electrically attached with the substrate. The galvanic potential of the structural layer is greater than the galvanic potential of the component. At least a portion of the structural material is covered with a protective material that has a galvanic potential less than or equal to the galvanic potential of the component. The sacrificial material is removed with a release solution. At least one of the protective material and release solution is surfactanated. For example, in an embodiment where the release solution is surfactanated, it functionalizes the surfaces of the component in synergy with the protective material to prevent the galvanic effect. Similarly, in cases where the protective material is surfactanated by adding a surfactant to it, the protective material and surfactant act in synergy to prevent galvanic degradation.

There are various types of substances that may be used in different such embodiments. For example, the protective material may comprise a self-assembled monolayer structure. The protective material may be formed with an alkanethiol, such as octadecanethiol. The release solution may comprise, for example, HF, BOE, KOH, or TMAH. The surfactant may comprise an alkyl group and a polyether-linked group commonly linked to an aryl group. The surfactant may also comprise a hydrophilic moiety and a hydrophobic moiety commonly linked to an aryl group. The sacrificial material may comprise an oxide, a nitride, a metal such as aluminum, or other material such as silicon or polysilicon. The structural layer may comprise a metal, such as gold, aluminum, copper, or platinum.

In a second set of embodiments, fabrication of a device begins by depositing a layer of material over a substrate, with the galvanic potential of the layer of material being greater than the galvanic potential of the substrate. At least a portion of the layer of material is covered with a protective material having a galvanic potential less than or equal to the galvanic potential of the substrate. Electrolytic insertion is performed by immersing the substrate in an electrolyte that includes a surfactant and applying a potential difference between the electrolyte and the substrate. The various types of substances that may be used in such embodiments are similar to those described above.

In a third set of embodiments, formation of a microelectromechanical structure begins by depositing sacrificial and structural material over a substrate to form a structural layer on a component electrically attached with the substrate, the galvanic potential of the structural layer being greater that the galvanic potential of the component. The component is passivated from galvanic degradation and the sacrificial material is removed with a release solution that includes a surfactant. The various types of substances that may be used in such embodiments are similar to those described above, and passivation of the component from galvanic degradation may comprise exposing the component to an organic alkene or organic alkyne. In some specific embodiments, such exposure may be mediated thermally or with light. In one embodiment, removal of the sacrificial material is partly performed before passivation of the component and partly performed after passivation of the component.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components.

DETAILED DESCRIPTION OF THE INVENTION

1. Introduction

Embodiments of the invention provide protection of component structures during fabrication processes in which a galvanic cell is produced. In some embodiments, the galvanic cell is an incidental consequence of the galvanic characteristics of the system, such as when a release is performed during fabrication of a MEMS device. In other embodiments, the galvanic cell is created specifically to perform certain parts of a process, such as to hydrogenate structures with an electrolytic insertion process. Protection of the component structures is achieved in one set of embodiments by covering structural layers with a protective material and by simultaneously including a surfactant either in the electrolyte that forms part of the galvanic cell or directly with the protective material. In another set of embodiments, component structures are passivated from galvanic degradation, such as with reaction products of an organic alkene or alkyne, and by including a surfactant in the electrolyte that forms part of the galvanic cell. In these embodiments, the inclusion of the surfactant works in synergy with the protective material to prevent the galvanic effects.

In the '916 application, the suppression of galvanic degradation resulting from including a surfactant in the electrolyte was disclosed. The inventors have also discovered that combining this technique with certain other techniques, such as those mentioned above, results in an unexpected synergy. The suppression of galvanic degradation from these combinations significantly exceeds the effect of either technique used alone, and exceeds the mere additive combination of these effects.

The discoveries of the inventors were made during the course of investigations into the fabrication of MEMS structures for use in an optical router, such as the one described in detail in copending, commonly assigned U.S. patent application Ser. No. 09/442,061, entitled "WAVELENGTH ROUTER," filed Nov. 16, 1999 by Robert T. Weverka et al., the entire disclosure of which is herein incorporated by reference for all purposes. Within such a wavelength router, optical signals are routed with MEMS micromirrors, some examples of various configurations of which are described in the following copending, commonly assigned applications, each of which is herein incorporated by reference in its entirety for all purposes: U.S. patent application Ser. No. 09/898,988, entitled "SYSTEMS AND METHODS FOR OVERCOMING STICTION USING A LEVER," filed Jul. 3, 2001 by Bevan Staple et al.; U.S. patent application Ser. No. 09/899,000, entitled "FREE-SPACE OPTICAL WAVELENGTH ROUTER BASED ON STEPWISE CONTROLLED TILTING MIRRORS," filed Jul. 3, 2001 by Victor Buzzetta et al.; U.S. patent application Ser. No. 09/899,001, entitled "TWO-DIMENSIONAL FREE-SPACE OPTICAL WAVELENGTH ROUTER BASED ON STEPWISE CONTROLLED TILTING MIRRORS," filed Jul. 3, 2001 by Victor Buzzetta; U.S. patent application Ser. No. 09/899,002, entitled "MEMS-BASED, NONCONTACTING, FREE-SPACE OPTICAL SWITCH," filed Jul. 3, 2001 by Bevan Staple and Richard Roth; U.S. patent application Ser. No. 09/899,004, entitled "BISTABLE MICROMIRROR WITH CONTACTLESS STOPS," filed Jul. 3, 2001 by Lilac Muller; U.S. patent application Ser. No. 09/899,014, entitled "METHODS AND APPARATUS FOR PROVIDING A MULTI-STOP MICROMIRROR," filed Jul. 3, 2001 by David Paul Anderson; U.S. patent application Ser. No. 09/941,998, entitled "MULTIMIRROR STACK FOR VERTICAL INTEGRATION OF MEMS DEVICES IN TWO-POSITION RETROREFLECTORS," filed Aug. 28, 2001 by Frederick Kent Copeland; U.S. patent application Ser. No. 10/080,789, entitled "METHODS FOR AFFIRMING SWITCHED STATUS OF MEMS BASED DEVICES," filed Feb. 21, 2002 by Bevan Staple et al.; and U.S. patent application Ser. No. 10/087,040, entitled "SYSTEMS AND METHODS FOR OVERCOMING STICTION," filed Feb. 28, 2002 by David Miller et al. In these MEMS micromirror configurations, the reflective character of metals such as gold is used to direct optical signals. The principles of the invention are, however, not limited to such applications and apply generally to fabrication processes that in which galvanic cells may be formed.

2. Use of Protective Material

Figure 1A:
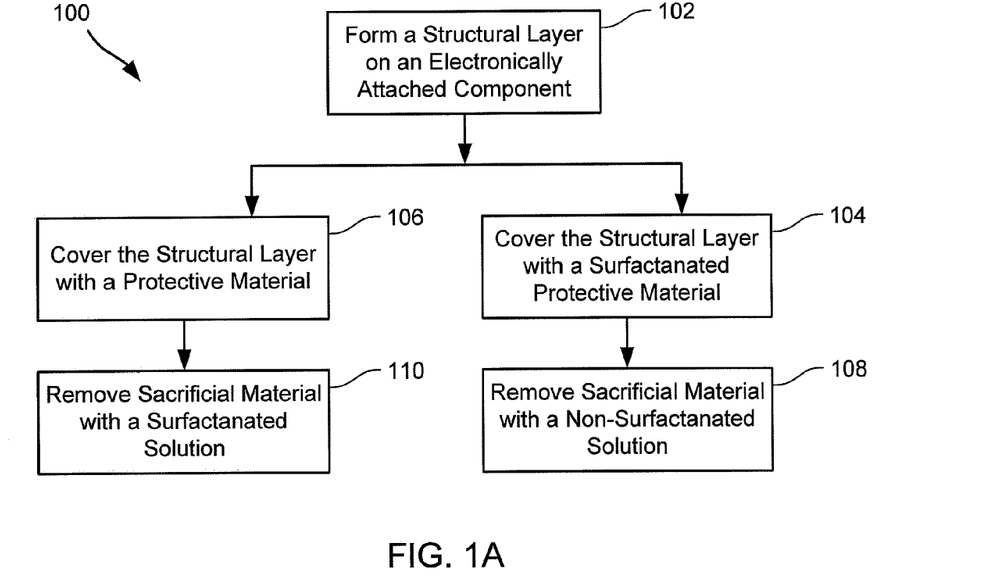
FIG. 1A is a flow diagram illustrating general methods for forming a microelectromechanical structure in accordance with an embodiment of the invention.

In one embodiment of the invention, a MEMS structure is formed according to the method 100 outlined with the flow diagram of FIG. 1A. In this embodiment, an intermediate structure is formed by depositing sacrificial and structural material over a substrate; this intermediate structure may correspond to the final MEMS structure except that it has not yet been released by removing the sacrificial material. In different embodiments, the sacrificial material comprises different materials. For example, it may comprise an oxide such as silicon oxide, a nitride such as silicon nitride, a metal such as aluminum, or another material such as silicon or polysilicon. As indicated at block 102, preparation of the intermediate structure includes forming a structural layer on a component that is electrically attached with the substrate. A galvanic potential of the structural layer is greater than a galvanic potential of the component. Generally, the galvanic potential of a material provides a measure of the vigor with which the material tends to dissolve in an electrolyte. A higher galvanic potential corresponds to a material that is more cathodic and a lower galvanic potential corresponds to a material that is more anodic. For example, metals such as gold, aluminum, and copper have higher galvanic potentials than undoped silicon or polysilicon. Accordingly, in one embodiment the intermediate structure includes a metal layer, such as gold, aluminum, copper, platinum, or other noble metal, formed over an undoped silicon layer that is electrically attached with the substrate. The galvanic potential of materials may be changed by doping so that, for example, a highly doped polysilicon layer may have a higher galvanic potential than an undoped silicon layer. Accordingly, in another embodiment the intermediate structure includes a highly doped polysilicon layer formed over an undoped silicon layer that is electrically attached with the substrate. Other embodiments may include a variety of arrangements of materials that meet the galvanic-potential constraints.

FIG. 1A illustrates at least two embodiments that correspond to different ways of synergistically combining the effects of a protective material and a surfactant. Along the left prong, at block 106, the structural layer is at least partially covered with a protective material that has a galvanic potential less than or equal to the galvanic potential of the component electrically attached with the substrate. Selectively covering the structural layer with a lower-galvanic-potential material causes a reduction in the effective galvanic potential of the structural layer, thereby reducing the galvanic effect when the sacrificial material is removed at block 110. In one embodiment, the protective material comprises a dielectric material and, in another embodiment, the protective material comprises a self-assembled monolayer structure ("SAMS").

Figure 1B:
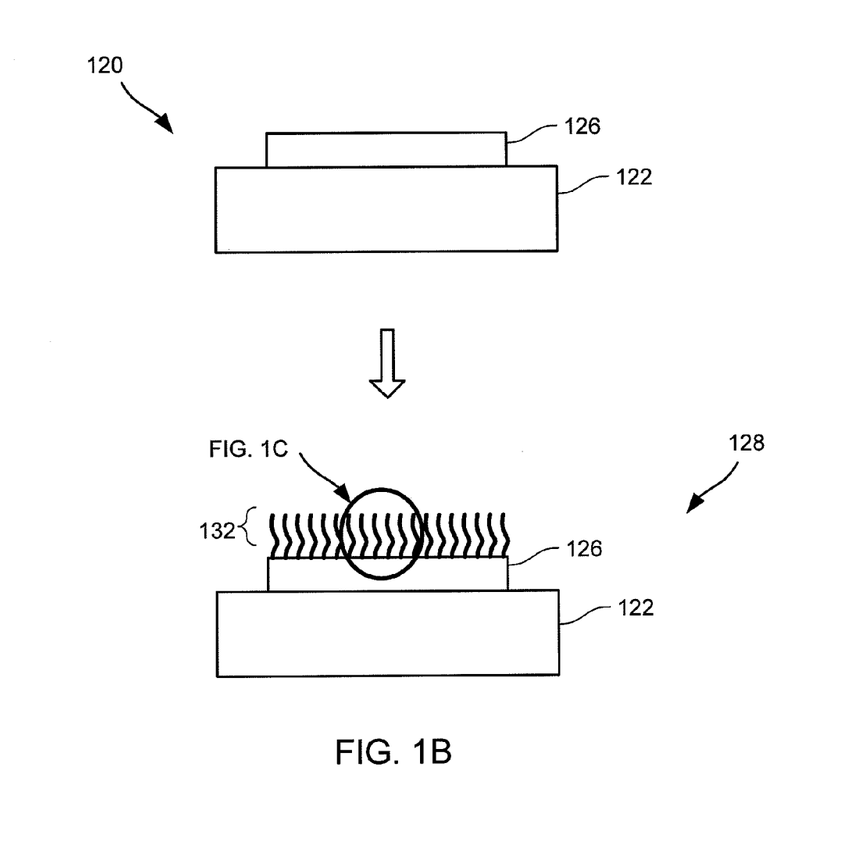
FIGS. 1B and 1C illustrate schematically the effect of covering a structural layer with protective material in accordance with an embodiment of the invention.
Figure 1C:
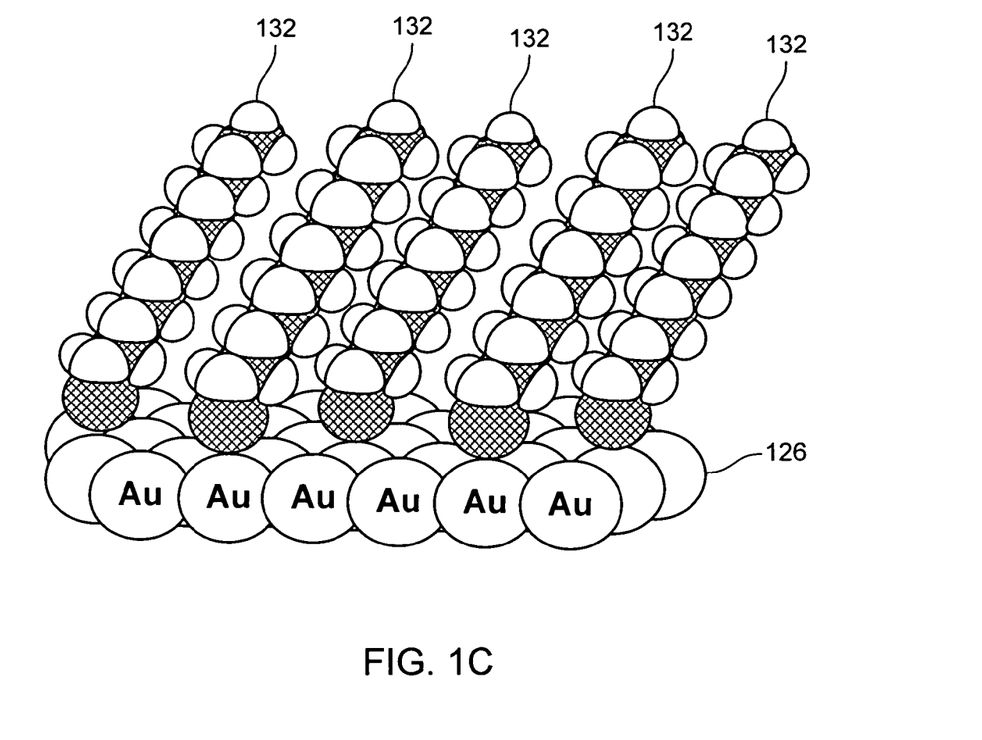

For example, in embodiments where the structural layer comprises a metal, the protective material may be formed with a thiol, such as a long-chain alkanethiol with the general chemical formula $C_nH_{2n+1}SH$, which strongly chemisorbs on metal surfaces from solution through the formation of a covalent-like bond. This is illustrated schematically in FIGS. 1B and 1C for protective material formed with octadecanethiol $C_{18}H_{38}SH$. In the top of FIG. 1B, a portion 120 of the intermediate structure is shown, including the structural layer 126 formed over the electrically attached component 122. Partially covering the structural layer results in a modified portion 128 of the intermediate structure shown at the bottom of FIG. 1B, in which several of the octadecanethiol molecules 132 are shown chemisorbed on the surface. FIG. 1C provides a more detailed view of part of FIG. 1B, showing the covalent-like bond between the structural layer 126 (shown in an exemplary embodiment to be a gold surface) and the sulfur atoms of the octadecanethiol molecules 132. Chemisorption of the alkanethiols produces a densely packed, inert, dielectric-like monolayer, which reduces the effective electrochemical potential of the structural layer 126. It also blocks the electron-transfer mechanism needed to produce an electrochemical reaction.

In other embodiments, alternatives or equivalents to the thiols may be used in the formation of the protective layer. For example, equivalent monolayers to those formed from the thiols (having RSH groups) may be formed from dialkyl disulfides (having RSSR groups). More generally, where the structural material comprises a metal, the protective material may comprise any monolayer bonded to the metal through a metal-sulfur bond. In other embodiments, the protective layer may be formed with isocyanate binding.

Where the structural layer comprises a different material, a different protective material may be used. For example, if the structural layer comprises silicon or polysilicon doped more heavily than the electrically attached component, the protective material may comprise an organosilane. Organosilanes bond with the silicon or polysilicon materials in a similar fashion to reacting the thiols with metallic layers. In some embodiments, the organosilanes comprise chlorosilanes, including mono-, di-, and trichlorosilanes, or alkoxysilanes, including mono-, di-, and trialkoyxsilanes, among others.

At block 110 of FIG. 1A, the method is completed by removing the sacrificial material from the intermediate structure to produce the final MEMS structure. Removal of the sacrificial material is performed in a release step using a surfactanated release solution. Inclusion of a surfactant in the release solution has the effect of suppressing the galvanic properties of the galvanic cell. It is hypothesized that this occurs by effectively deactivating one or both of the electrodes of the galvanic cell by isolating it from the electrolytic component of the release solution. The inventors have found, however, that the combination of effects from providing the protective material at block 106 and from including the surfactant in the release solution at block 110 combine synergistically in suppressing the galvanic effects. The release solution may also remove some or all of the protective material at the same time as the sacrificial material is removed.

A variant of the method is illustrated with the right prong of FIG. 1A. In this embodiment, the surfactant is included with the protective material at block 104 by covering the structural layer with a surfactanated protective material. The same type of protective material may be used in the embodiments corresponding to the right prong of FIG. 1A as in the embodiments corresponding to the left prong. For example, where the structural layer comprises a metal, the protective material may be formed with a thiol, including long-chain alkanethiols of the type discussed above in connection with FIGS. 1B and 1C. At block 108 of FIG. 1A, the sacrificial material is removed from the intermediate structure to produce the final MEMS structure. Since in this embodiment a surfactant was included at block 104 when the structural layer was covered at block 104, the release solution may comprise a nonsurfactanated solution. In still other embodiments, a surfactant may be included both when the structural layer is covered with protective material and when the intermediate structure is released.

In one embodiment, the effect of the release solution in dissolving certain types of materials is exploited in selecting the protective material to be used. For example, the protective material may comprise SiN, which acts to protect the structural layer during the release and which is simultaneously removed during the release.

Figure 1D:
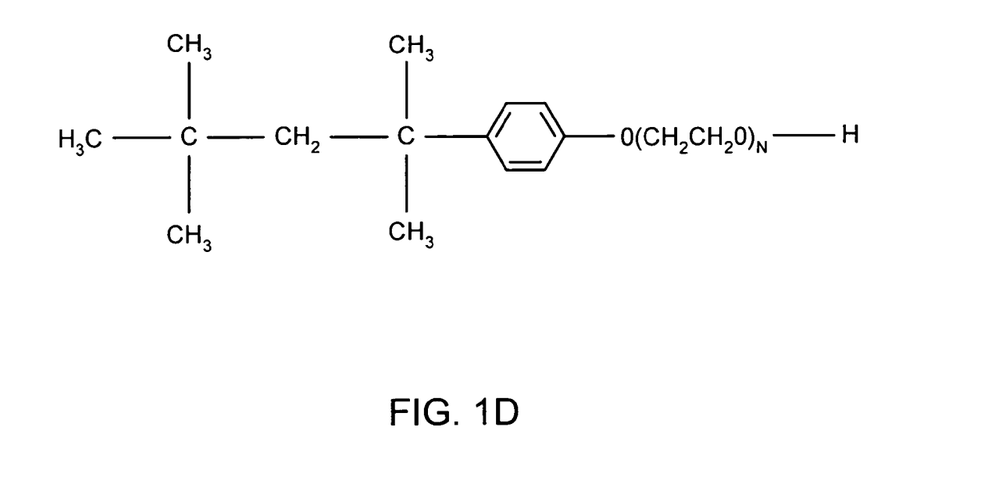
FIG. 1D is a diagram showing the chemical structure of certain surfactants used with embodiments of the invention.

In one embodiment, the surfactant comprises a compound with an alkyl group and a polyether-linked hydroxy group commonly linked to an aryl group. Such a compound may be functionally characterized by the fact that a hydrophilic moiety and a hydrophobic moiety are commonly linked to an aryl group. One such compound is marketed under the trade name Triton X-100™ and has the structure shown in FIG. 1D. The "X" series of Triton surfactants are produced from octylphenol polymerized with ethylene oxide. The number "100" in the trade name is indirectly related to the number of ethylene oxide units in the structure. Triton X-100™ has an average of N=9.5 ethylene oxide units per molecule, with an average molecular weight of 625. In commercially available products, lower and higher mole adducts may also be present in lesser amounts, varying with a given supplier's standard manufacturing conditions. A by-product formed during the reaction is polyethylene glycol, a homopolymer of ethylene oxide. Acid is also typically added to the product to neutralize the product after the base-catalyzed reaction is completed. Some commercial preparations are known to contain peroxides up to 0.22% hydrogen peroxide ($H_2O_2$) equivalents. Examples of commercially available compounds that have a similar structure to Triton X-100™ include Igepal CA-630™ and Nonidet P-40™.

Figure 2A:
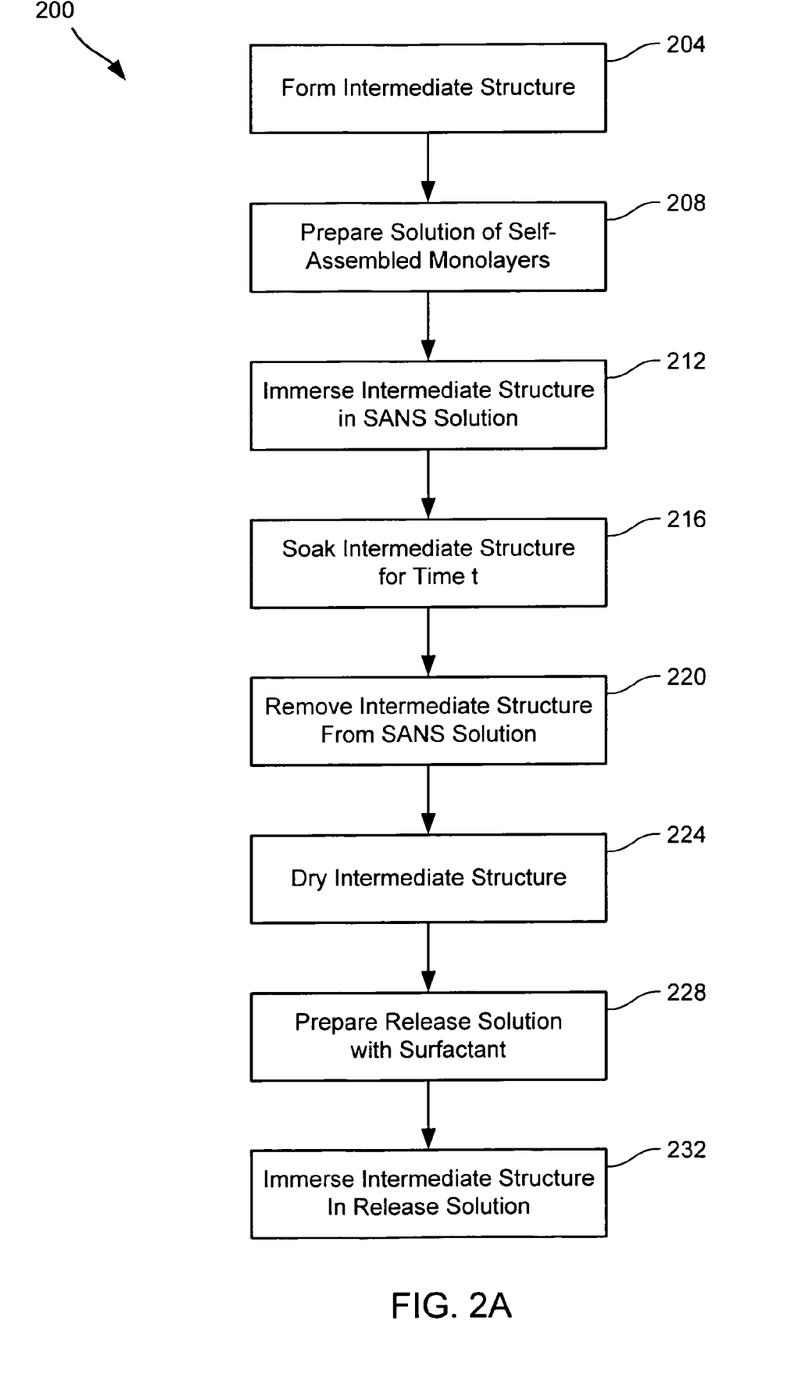
FIG. 2A is a flow diagram illustrating a detailed method for forming a microelectromechanical structure in accordance with an embodiment of the invention.
Figure 2B:
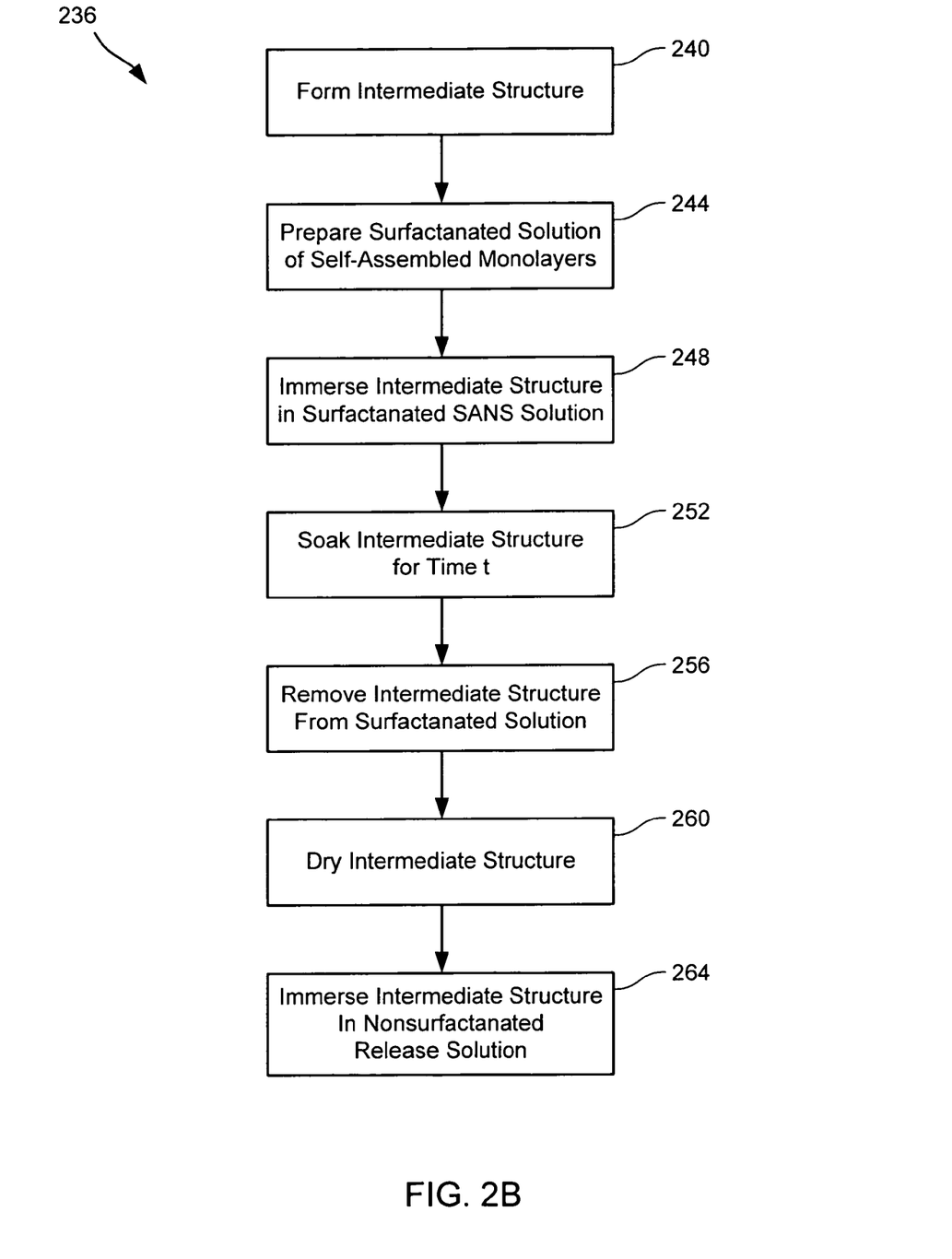
FIG. 2B is a flow diagram illustrating another detailed method for forming a microelectromechanical structure in accordance with an embodiment of the invention.

FIGS. 2A and 2B provide more detailed flow diagrams of specific procedures to be used in forming a microelectromechanical structure in accordance with embodiments of the invention. FIG. 2A corresponds generally to the left prong of FIG. 1A and FIG. 2B corresponds generally to the right prong of FIG. 1A. These exemplary procedures both take advantage of the synergistic effect described above.

Thus, according to the method 200 illustrated in FIG. 2A, the intermediate structure is formed at block 204 using any suitable combination of deposition, patterning, and/or etching steps over a substrate. The intermediate structure generally includes both sacrificial and structural material, including a structural layer on a component electrically attached with the substrate. At block 208, a SAMS solution is prepared. The inventors have discovered that a 1-10 mM solution of alkanethiols is effective to provide the desired coverage of protective material. For example, a 7.5 mM solution of octadecanethiol $C_{18}H_{38}SH$ may be prepared by adding a measured 0.44 g of octadecanethiol crystals to 200 mL of ethanol and stirring vigorously until all of the $C_{18}H_{38}SH$ is dissolved. Other alkanethiols may alternatively be used, including ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, nonadecanethiol, eicosanethiol, heneicosanethiol, docosanethiol, tricosanethiol, tetracosanethiol, pentacosanethiol, hexacosanethiol, and still longer-chain alkanethiols. While longer-chain alkanethiols generally provide better monolayer coverage, use of a shorter-chain alkanethiol may be preferred to reduce cost while still providing sufficient suppression of galvanic-cell effects. In addition, aromatic thiols may alternatively be used.

At block 212, the intermediate structure is immersed in the SAMS solution so that the SAMS may passivate the structural layer. The intermediate structure is soaked in the solution for a period of time t, as noted at block 216. A suitable period of time has been found by the inventors to be between one and twenty-four hours. Better coverage is generally achieved with a longer time period, but experiments have confirmed that adequate protection is achieved with as small a time period as one hour; such a smaller time period may be preferred in production environments. To ensure adequate passivation, it is preferred that the solution remain undisturbed during the soak. After soaking, the intermediate structure is removed from the solution at block 220. It may be soaked for about a minute in ethanol to remove any residue of the SAMS solution, after which it is dried at block 224, such as with clean dry air.

The release solution is prepared at block 228 to include a surfactant. In one embodiment, the release solution comprises HF with a relative concentration of Triton X-100™ of about 0.1 vol. %. This corresponds to adding about five drops of Triton X-100™ to a beaker holding about 200 mL of HF. The MEMS device is released at block 232 by immersing the intermediate structure in the release solution until the sacrificial material is removed. In other embodiments, the release solution may comprise a modification of HF, such as buffered oxide etch ("BOE") or other electrolyte that causes a galvanic reaction, such as KOH or tetramethyl ammonium hydroxide ("TMAH").

In the method 236 illustrated in FIG. 2B, a similar procedure is followed, except that the protective material is surfactanated rather than the release solution. The same intermediate structure as formed at block 204 of FIG. 2A is formed at block 240 of FIG. 2B. At block 244, a surfactanated SAMS solution is prepared by additionally adding a surfactant to the protective-material solution, and the intermediate structure is immersed in the surfactanated SAMS solution at block 248. The inventors have found that the 1-10 mM solution of alkanethiols prepared as described above, with about 0.1 vol. % of Triton X-100™ additionally added, effectively suppresses galvanic effects when the final MEMS structure is later released. The remainder of the method 236 proceeds similarly to that described with respect to FIG. 2A. At block 252, the intermediate structure is soaked for a period of time in the surfactanated SAMS solution, a suitable period of time having been found by the inventors to be between one and twenty-four hours. At block 256, the intermediate structure is removed from the surfactanated solution, and perhaps rinsed in ethanol, after which it is dried at block 260. The release at block 264 may thus proceed with an unsurfactanated release solution, such as 48% HF solution, BOE, KOH, TMAH, or other release solution.

Figure 3A:
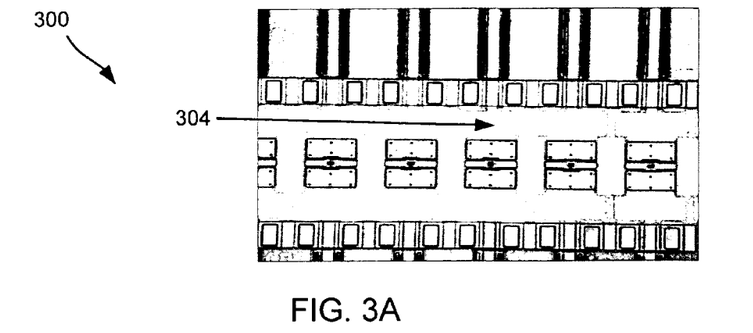
FIGS. 3A and 3B are micrographs comparing the quality of structural layers of a microelectromechanical structure.
Figure 3B:
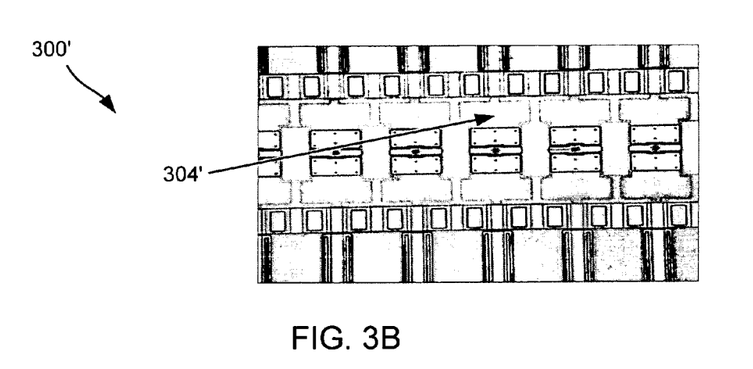
Figure 4:
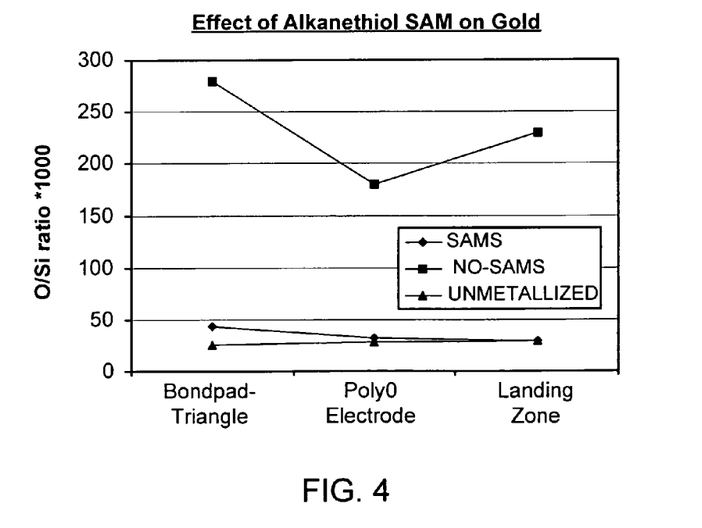
FIG. 4 is a graph of results measured to quantify levels of galvanic degradation.

FIGS. 3 and 4 provide results of experiments performed to confirm the suppression of galvanic degradation by the combination of effects. FIGS. 3A and 3B provide micrographs of micromirror MEMS structures made with a configuration used in the wavelength routers being developed by the inventors. FIG. 3A shows such a micromirror structure 300 prepared according to the method described with respect to FIG. 2A and FIG. 3B shows for comparison a corresponding micromirror structure 300' prepared without forming the protective layer in accordance with blocks 208-224 of FIG. 2A. Both micromirror 300 and 300' structures include a plurality of reflective gold surfaces 304 and 304' formed over an electrically connected polysilicon layer. These reflective gold surfaces 304 and 304' thus correspond to the structural layers discussed more generally above. As evident from the micrographs, FIG. 4A exhibits no staining of the gold structural layer 304, indicating that there is insignificant galvanic degradation. By contrast, FIG. 4B exhibits considerable staining of the gold structural layer 304', indicating that there is a significant level of galvanic degradation. These results demonstrate that coupling the steps of forming a SAMS protective layer and adding a surfactant to the release solution have a substantial effect on galvanic degradation.

This qualitative result is reinforced with the quantitative results presented in FIG. 4. In this instance, micromirror structures like those shown in FIGS. 3A and 3B have been produced in the following three ways: (1) as set forth in the description made with respect to FIG. 2A, with both a surfactant added to the release solution and with steps to provide a protective SAMS covering of the gold structural layers; (2) with a method similar to that set forth in FIG. 2A, including a surfactant in the release solution, but without steps to provide a protective SAMS covering of the gold structural layers; and (3) with a method similar to that set forth in FIG. 2A, including a surfactant in the release solution, but without steps to provide a SAMS covering and without including any metal in the intermediate structure. Measurements were performed on different components of the resulting structures to determine relative concentrations of oxygen to silicon, with the diamonds, squares, and triangles corresponding respectively to structures (1), (2), and (3) identified above. The results for the nonmetallized structure, for which there is no galvanic degradation, is shown with the triangles and provides a baseline for comparison of results in which the use of metal sets up a galvanic cell. Thus, when metal is included in the structure but the fabrication procedure is otherwise unchanged, the oxygen concentration relative to the silicon concentration increases sharply, as shown by the squares, even when a surfactant is included in the release solution. The data represented by the diamonds show that when the use of a surfactant in the release solution is combined with using SAMS as a protective material, the galvanic degradation is almost entirely suppressed. The inventors also performed experiments in which a protective SAMS layer was formed, but without the use of a surfactant in the release solution. Such results occasionally showed some level of suppression of galvanic effects, but the suppression was poor and the results were not repeatable.

The mechanism by which galvanic degradation is reduced is believed to result from a synergistic combination of effects. The alkanethiol or other protective covering provides passivation of the metal or other high-galvanic-potential structural layer. This action is then coupled with the attachment of the surfactant to the silicon, polysilicon, or other low-galvanic potential surface during release. It is believed that the electrochemical effect of the electrolyte is impeded when the hydrophobic tail of the surfactant attaches to the hydrophobic hydride-terminated surface through hydrophobic-hydrophobic interactions. This combination of effects almost entirely suppresses galvanic degradation.

3. CMOS and CMOS-Integrated MEMS Processes

In the above examples related to the fabrication of MEMS structures, the galvanic cell was a by-product of the materials used in the fabrication processes. In some other applications, however, a galvanic cell may be created deliberately to achieve an aspect of fabrication. One example occurs in the use of electrolytic-injection techniques in complementary metal-oxide-semiconductor ("CMOS") processing. Hydrogenation of materials is sometimes achieved by deliberately subjecting a substrate to galvanic forces. This may be done in processes that produce a combination of electromechanical MEMS structures and CMOS transistor structures used in controlling the operation of the MEMS structures, sometimes referred to as "CMOS-integrated MEMS" structures. Such structures often use aluminum and/or copper for interconnect structures, in addition to the use of gold and other metals.

Figure 5A:
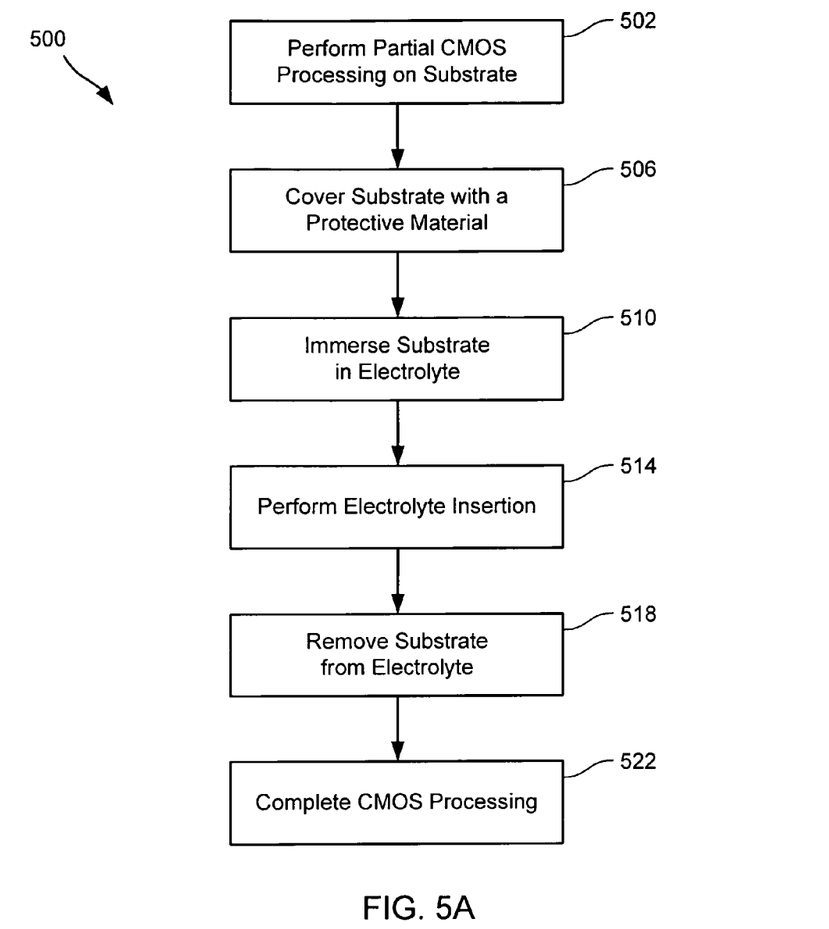
FIG. 5A is a flow diagram illustrating a method for performing CMOS processing in accordance with an embodiment of the invention.
Figure 5B:
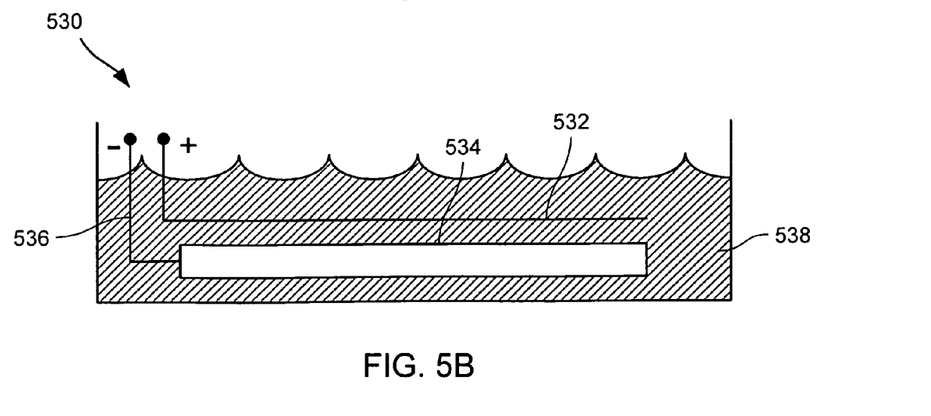
FIG. 5B provides a schematic illustration of an arrangement used in performing electrolytic insertion within the CMOS method illustrated in FIG. 5A.

FIG. 5A provides a flow diagram for an exemplary method 500 that uses electrolytic insertion as part of a CMOS or CMOS-integrated MEMS process. At block 502, a portion of the CMOS and/or MEMS processing is performed on a substrate. At block 506, the substrate is covered with a protective material such as with the alkanethiol SAMS described above. Alternative or equivalent protective materials may also be used, including any monolayer that bonds to metal through a metal-sulfur bond, such as those formed with dialkyl disulfides, and including those based upon isocyanate binding. The substrate is subsequently immersed in an electrolyte at block 510 so that electrolytic insertion may be performed at block 514 to inject hydrogen. FIG. 5B provides a schematic representation of an electrolytic bath 530 that may be used for the electrolytic insertion. When the substrate 534 is immersed in the electrolyte 538, it acts as a cathode through an electrical contact 536. The electrolyte may comprise HF, HCl, $H_2SO_4$, NaOH, KOH, or TMAH, or another acid. An anode 532 completes the electrolytic cell and may comprise platinum, gold, graphite, or other suitable material. After the electrolytic insertion is completed, the substrate is removed from the electrolyte at block 518, and subsequently cleaned and dried so that the CMOS or CMOS-integrated MEMS process may be completed at block 522.

4. Direct Passivation

In another set of embodiments, galvanic degradation is suppressed by directly passivating the component electrically attached with the substrate. This is shown for one embodiment of the invention with the flow diagram provided in FIG. 6. A MEMS structure is formed with a method 600 that begins by forming an intermediate structure by depositing sacrificial and structural material over a substrate; this intermediate structure may correspond to the final MEMS structure except that it has not yet been released by removing the sacrificial material. In certain embodiments, the sacrificial material comprises an oxide, such as silicon oxide, and in other embodiments, it comprises a nitride, such as silicon nitride. As indicated at block 604, preparation of the intermediate structure includes forming a structural layer on a component that is electrically attached with the substrate. The galvanic potential of the structural layer is greater than a galvanic potential of the component. At block 608, the electrically attached component is passivated from galvanic degradation. In embodiments where the electrically attached components comprise silicon, this may be performed as described in greater detail below by using a hydrosilylation process. At block 612, the final MEMS structure is released from the intermediate structure by removing the sacrificial material with a release solution that comprises a surfactant. In one embodiment, the surfactant comprises a compound with an alkyl group and a polyether-linked hydroxy group commonly linked to an aryl group, such as described above.

Figure 6:
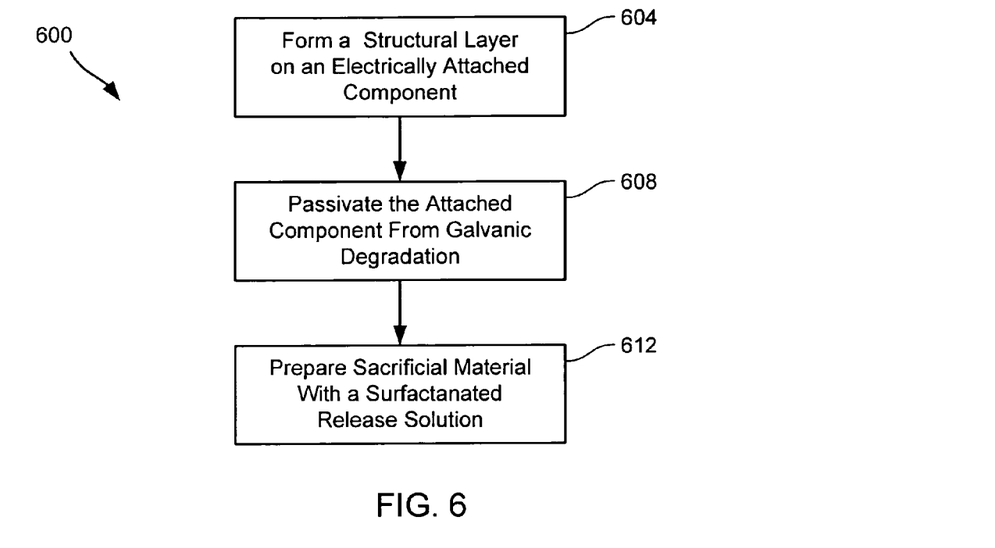
FIG. 6 is a flow diagram illustrating a general method for forming a microelectromechanical structure in accordance with another embodiment of the invention.

It is evident that aspects of the method illustrated for the embodiment of FIG. 6 are similar to aspects of the embodiment illustrated in FIG. 1A. The methods differ principally in that the use of protective material on the structural layer is substituted with passivation of the electrically attached component. As for the embodiment that uses protective material on the structural layer, the inventors have discovered a synergistic effect when passivation of the electrically attached component is combined with the inclusion of a surfactant in the release solution. This combination of effects almost entirely eliminates the degradation resulting from the galvanic cell otherwise created during release.

Figure 7:
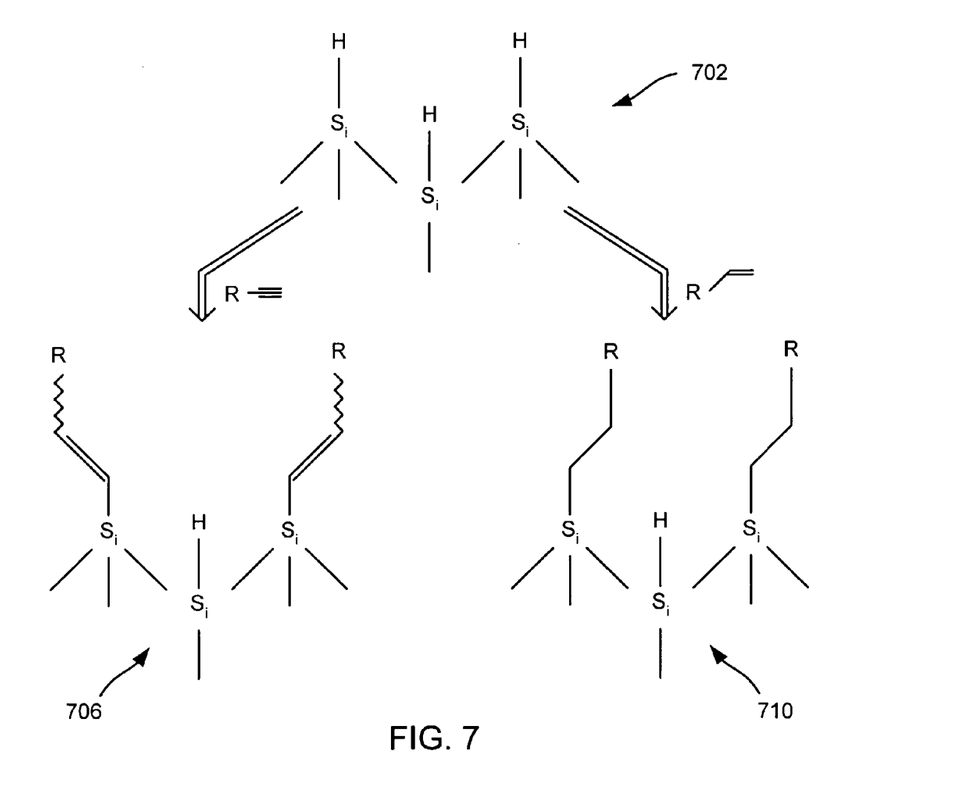
FIG. 7 provides chemical-structure diagrams illustrating the effect of hydrosilylation in an embodiment of the invention.

In embodiments that use an electrically attached component comprising silicon, passivation may be accomplished by hydrosilylation of the electrically attached component with organic alkenes or alkynes. An overview of the reactions used in these embodiments is shown in FIG. 7. The reactions begin with a hydride-terminated silicon or polysilicon surface 702 that is exposed either to an alkyne as in the left portion of FIG. 7 or to an alkene as in the right portion of FIG. 7. Hydrosilylation with an alkyne replaces the hydride termination with an alkenyl termination, such as shown by structure 706. Similarly, hydrosilylation with an alkene replaces the hydride termination with an alkyl termination such as shown by structure 710. These reactions may be mediated in different ways, including thermal hydrosilylation, light- and UV-promoted hydrosilylation, and Lewis-acid-mediated hydrosilylation, although the invention is not limited by a particular type of mediation and alternative mediations may also be used. Some of these mediations are discussed in more specific detail below.

Figure 8:
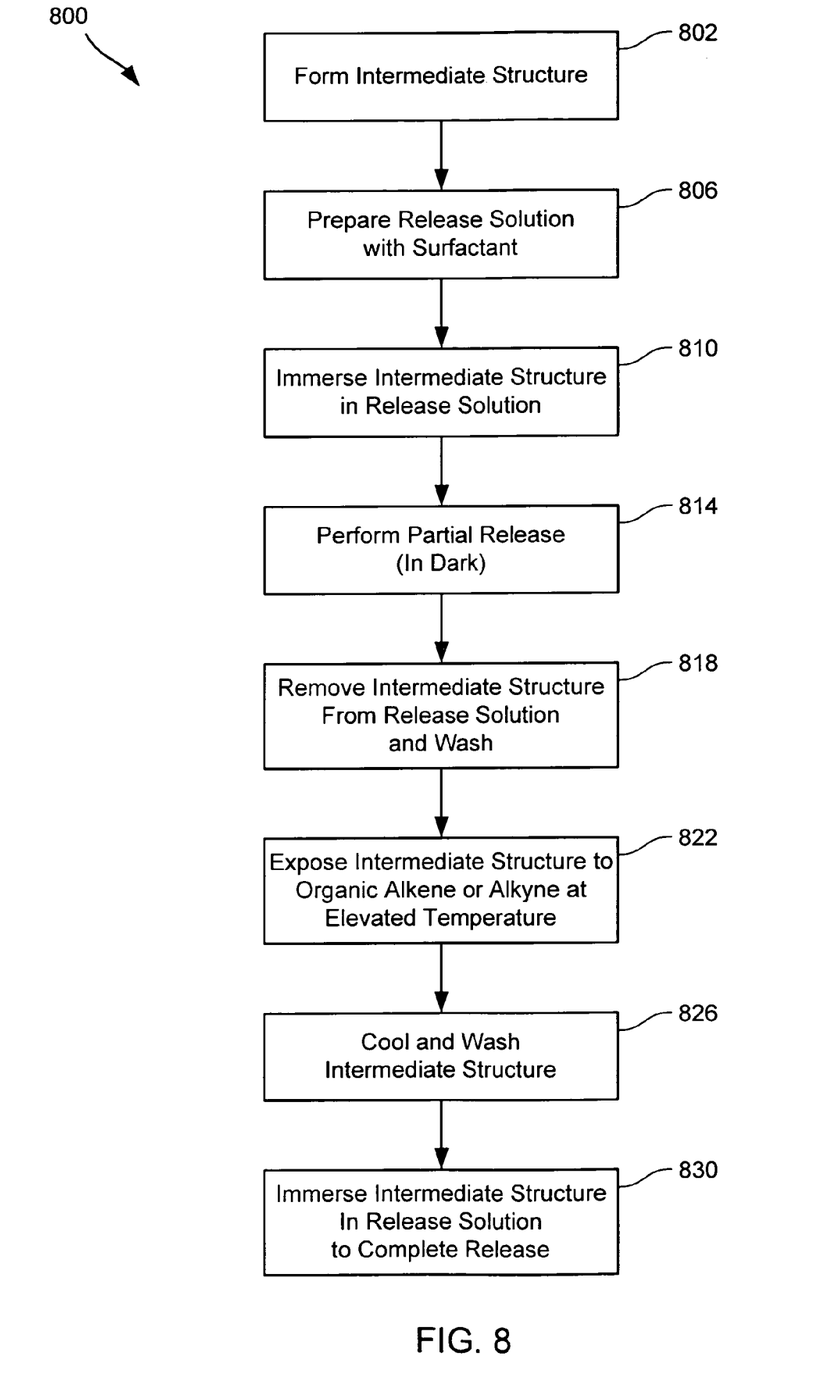
FIGS. 8 and 9 are flow diagrams illustrating detailed methods for forming a microelectromechanical structure in accordance with further embodiments of the invention.
Figure 9:
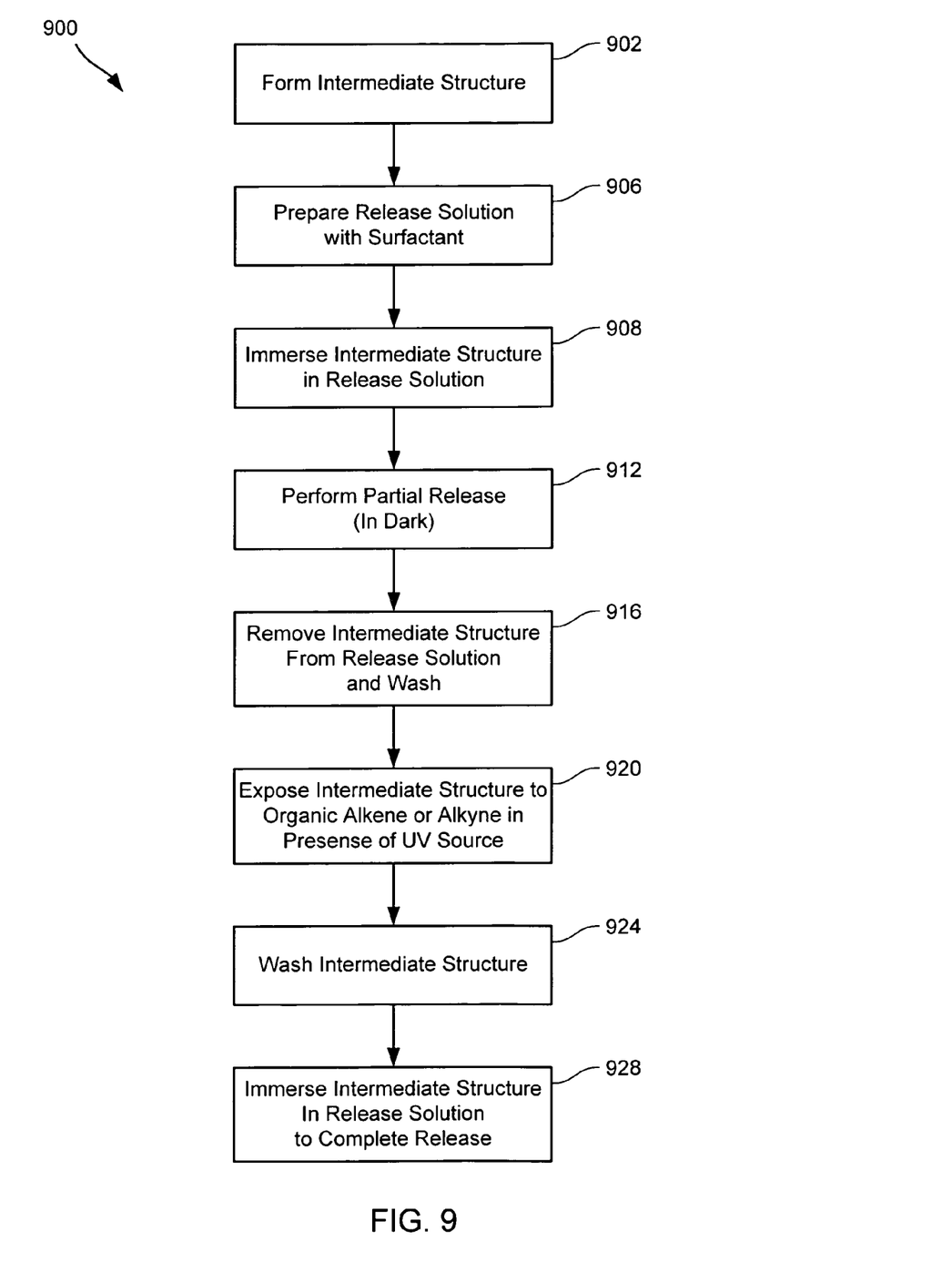

Passivation of the electrically attached component in this way permits organic alkene or alkyne monolayers to be controllably and permanently attached to the hydride-terminated silicon or polysilicon surfaces. This protects the electrically attached component from electrochemical degradation by providing a barrier to the etching during a release. To achieve adequate protection, it is generally preferred that the carbon chains in the alkene or alkyne molecules be sufficiently long. The inventors have found that dodecene and dodecyne molecules have sufficiently long carbon chains, but passivation with alternative alkenes and alkynes remains within the scope of the invention. For example, passivation may be also be performed with ethylene, propene, butene, pentene, hexene, heptene, octene, nonene, decene, undecene, tridecene, tetradecene, pentadecene, hexadecene, heptadecene, octadecene, nonadecene, eicosene, heneicosene, docosene, tricosene, tetracosene, pentacosene, hexacosene, and still longer-chain alkenes, and with propyne, butyne, pentyne, hexyne, heptyne, octyne, nonyne, decyne, undecyne, tridecyne, tetradecyne, pentadecyne, hexadecyne, heptadecyne, octadecyne, nonadecyne, eicosyne, heneicosyne, docosyne, tricosyne, tetracosyne, pentacosyne, hexacosyne, and still longer-chain alkynes. FIGS. 8 and 9 provide flow diagrams that specify in detail how the passivation may be performed with thermal hydrosilylation and light/UV-mediated hydrosilylation respectively. In these descriptions, the release is performed in two distinct steps, although in alternative embodiments, the release may be performed as a single step. When a release is performed in two steps, the first release is generally stopped before galvanic-cell effects are significant to cause detectable degradation.

Referring first to FIG. 8, fabrication of a MEMS structure with a method 800 that includes passivation by thermal hydrosilylation begins by forming an intermediate structure at block 802. The intermediate structure may be formed using any suitable combination of deposition, patterning, and/or etching steps over a substrate. Accordingly, the intermediate structure generally includes both sacrificial and structural material, including a structural layer on a component electrically attached with the substrate. At block 806, a release solution is prepared, including a surfactant. In one embodiment, the release solution comprises HF with a relative concentration of Triton X-100™ of about 0.1 vol. %, which may be prepared by adding about five drops of Triton X-100™ to a beaker holding about 200 mL of HF. In other embodiments, the release solution may comprise BOE, KOH, TMAH, or equivalent.

If the release is to be performed in two distinct steps, the intermediate structure is immersed in the release solution at block 810 so that a partial release may be performed at block 814. Before immersion in the release solution, the intermediate structure may be washed with distilled water and ethanol. This initial portion of the release is generally performed in darkness and for a sufficient period of time to expose the surfaces of targeted electrically attached components, but not long enough to degrade structures due to galvanic-cell effects.

The partially released structure is removed from the release solution and washed at block 818. Washing may be performed with distilled water, ethanol, and pentane. Exposure of the surfaces of the targeted electrically attached components improves the effectiveness of the subsequent passivation. Particularly in embodiments where the intermediate structure is formed so that the electrically attached components are already exposed, performing an initial partial release in blocks 810-818 may be unnecessary.

Passivation of the electrically attached components is performed at block 822 by exposing the (partially released) intermediate structure to an organic alkene or alkyne. In an exemplary embodiment, exposure is performed by covering the intermediate structure with a 25% (1.25 M) mesitylene solution of 1-dodecene in an inert nitrogen atmosphere. To mediate the hydrosilylation thermally, the intermediate structure is exposed at an elevated temperature under an inert atmosphere for a period of time. In the exemplary embodiment, the mesitylene solution of 1-dodecene is maintained at a temperature of 180-200° C. for between 30 and 90 minutes; for example, the period of exposure may be about one hour.

After the thermally mediated passivation is completed, the intermediate structure is cooled to room temperature and washed at block 826. Washing may be performed, for example, with successive treatments of dichloromethane (three times for five minutes), pentane (three times for five minutes), ethanol (three times for five minutes), and distilled water (three times for five minutes). Thereafter, the release of the MEMS device is completed at block 830 by immersing it again in the release solution with a surfactant.

A similar method 900 is shown with the flow diagram in FIG. 9 for an light/UV-mediated hydrosilylation. At block 902, the intermediate structure is formed with the conventional micromachining techniques of deposition, patterning, and/or etching so that a structural layer is formed on a component electrically attached with the substrate. At block 906, the release solution is prepared including a surfactant. The relative concentration of the surfactant is the same as described with respect to FIG. 8 and may, for example, include about 0.1 vol. % of Triton X-100™ in HF, BOE, KOH, TMAH, or equivalent. If the release is to be performed in two steps, the intermediate structure may be partially released by immersing it in the release solution at block 908, exposing it at block 912 for a period of time sufficient to expose surfaces of the electrically attached components, and removing and washing the intermediate structure at block 916. The partial release is generally stopped before degradation due to galvanic-cell effects is manifested. Washing may be performed with distilled water, ethanol, and pentane. In embodiments where the electrically attached components of the intermediate structure are already exposed, the initial partial release in blocks 908, 912, and 916 may be unnecessary.

Passivation of the electrically attached components is performed at block 920 by exposing the (partially released) intermediate structure to an organic alkene or alkyne. In an exemplary embodiment, exposure is performed by covering the intermediate structure with 1-dodecene in an inert nitrogen atmosphere. To mediate the hydrosilylation with light, the intermediate structure is then exposed to ultraviolet radiation for a period of time. In the exemplary embodiment, exposure is performed with a 254-nm source having a power density of 9 mW/cm$^2$ at a distance of about 2 cm from the intermediate structure for about 30 minutes.

After the light/UV-mediated passivation is completed, the intermediate structure is washed, such as with successive treatments of dichloromethane (three times for five minutes), pentane (three times for five minutes), ethanol (three times for five minutes), and distilled water (three times for five minutes). Thereafter, the release of the MEMS device is completed at block 928 by immersing it again in the release solution with a surfactant.

Still other methods of mediating the hydrosilylation may be performed using techniques known to those of skill in the art. The inventors have performed experiments with MEMS structures made according to the methods described with respect to FIGS. 8 and 9 and have confirmed that galvanic degradation is significant suppressed. In particular, by using the methods described for the exemplary embodiments, no evidence of galvanic degradation could be detected.

Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A method for forming a microelectromechanical structure, the method comprising:
   depositing sacrificial and structural material over a substrate to form a structural layer on a component electrically attached with the substrate, wherein a galvanic potential of the structural layer is greater than a galvanic potential of the component;
   passivating the compnent from galvanic degradation;
   adding a surfactant to a release solution to produce a surfactanated release solution; and
   removing the sacrificial material with the surfactanated release solution.

2. The method recited in claim 1 wherein the release solution comprises HF.

3. The method recited in claim 1 wherein the surfactant comprises a hydrophilic moiety and a hydrophobic moiety commonly linked to an aryl group.

4. The method recited in claim 1 wherein the sacrificial material comprises an oxide.

5. The method recited in claim 1 wherein the sacrificial material comprises a nitride.

6. The method recited in claim 1 wherein the sacrificial material comprises a metal.

7. The method recited in claim 1 wherein the sacrificial material comprises silicon or polysilicon.

8. The method recited in claim 1 wherein removing the sacrificial material comprises removing a first portion of the sacrificial material before passivating the component from galvanic degradation and removing a second portion of the sacrificial material after passivating the component from galvanic degradation.

9. The method recited in claim 1 wherein the surfactant comprises an alkyl group and a polyether-linked hydroxy group commonly linked to an aryl group.

10. The method recited in claim 9 wherein the surfactant is included in the release solution with a concentration approximately between 0.01 and 0.1 vol. %.

11. The method recited in claim 1 wherein the structural layer comprises a metal.

12. The method recited in claim 11 wherein the metal is selected from the group consisting of gold, aluminum, copper, and platinum.

13. The method recited in claim 1 wherein passivating the component from galvanic degradation comprises exposing the component to an organic alkene or organic alkyne.

14. The method recited in claim 13 wherein exposing the component to the organic alkene or organic alkyne is performed in the presence of ultraviolet radiation.

15. The method recited in claim 13 wherein exposing the component to the organic alkene or organic alkyne is performed at a temperature greater than room temperature.

16. The method recited in claim 15 wherein:
   exposing the component to the organic alkene or organic alkyne is performed for a period of time between 30 and 90 minutes; and
   the temperature is between 180 and 200° C.

* * * * *

UNITED STATES PATENT AND TRADEMARK OFFICE
CERTIFICATE OF CORRECTION

| | | |
|---|---|---|
| PATENT NO. | : 7,560,037 B2 | Page 1 of 1 |
| APPLICATION NO. | : 11/213466 | |
| DATED | : July 14, 2009 | |
| INVENTOR(S) | : Staple et al. | |

It is certified that error appears in the above-identified patent and that said Letters Patent is hereby corrected as shown below:

Column 13, line 28, -- "compnent" -- should be -- "component" --

Signed and Sealed this

First Day of September, 2009

David J. Kappos
*Director of the United States Patent and Trademark Office*